(12) United States Patent
Li et al.

(10) Patent No.: US 8,252,687 B2
(45) Date of Patent: Aug. 28, 2012

(54) BARRIER SLURRY FOR LOW-$K$ DIELECTRICS

(75) Inventors: Shoutian Li, Naperville, IL (US); Steven Grumbine, Aurora, IL (US); Jeffrey Dysard, St. Charles, IL (US); Pankaj Singh, Plainfield, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 384 days.

(21) Appl. No.: 12/584,343

(22) Filed: Sep. 3, 2009

(65) Prior Publication Data

US 2010/0075502 A1    Mar. 25, 2010

Related U.S. Application Data

(60) Provisional application No. 61/098,600, filed on Sep. 19, 2008.

(51) Int. Cl.
*H01L 21/302* (2006.01)
(52) U.S. Cl. ..... 438/692; 252/79.1; 252/79.2; 252/79.3; 252/79.4; 438/689; 438/690
(58) Field of Classification Search ........ 252/79.1–79.4; 438/689, 690, 692
See application file for complete search history.

(56) References Cited

U.S. PATENT DOCUMENTS

| | | | |
|---|---|---|---|
| 6,386,950 B1 * | 5/2002 | Jacquinot et al. | 451/41 |
| 6,582,761 B1 | 6/2003 | Nishimoto et al. | |
| 6,592,776 B1 * | 7/2003 | Wang et al. | 252/79.1 |
| 2006/0249482 A1 * | 11/2006 | Wrschka et al. | 216/88 |
| 2007/0181534 A1 * | 8/2007 | Kamimura | 216/88 |
| 2007/0254485 A1 | 11/2007 | Mao et al. | |
| 2008/0020680 A1 | 1/2008 | Vacassy et al. | |
| 2009/0224200 A1 * | 9/2009 | Jha et al. | 252/79.2 |
| 2009/0246956 A1 * | 10/2009 | Takamiya et al. | 438/693 |

* cited by examiner

*Primary Examiner* — Nadine G Norton
*Assistant Examiner* — Maki Angadi
(74) *Attorney, Agent, or Firm* — Thomas E. Omholt; Francis J. Koszyk; Steven D. Weseman

(57) ABSTRACT

The invention provides a chemical-mechanical polishing composition for polishing a substrate. The polishing composition comprises silica, a compound selected from the group consisting of an amine-substituted silane, a tetraalkylammonium salt, a tetraalkylphosphonium salt, and an imidazolium salt, a carboxylic acid having seven or more carbon atoms, an oxidizing agent that oxidizes a metal, and water. The invention further provides a method of chemically-mechanically polishing a substrate with the aforementioned polishing composition.

46 Claims, No Drawings

BARRIER SLURRY FOR LOW-κ DIELECTRICS

CROSS-REFERENCE TO A RELATED APPLICATION

This patent application claims the benefit of U.S. Provisional Patent Application No. 61/098,600, filed Sep. 19, 2008, which is incorporated by reference.

BACKGROUND OF THE INVENTION

Compositions and methods for planarizing or polishing the surface of a substrate, especially for chemical-mechanical polishing (CMP), are well known in the art. Polishing compositions (also known as polishing slurries) used in CMP processes typically contain an abrasive material in an aqueous solution and are applied to a surface by contacting the surface with a polishing pad saturated with the polishing composition. Typical abrasive materials include aluminum oxide, cerium oxide, silicon dioxide, and zirconium oxide. The polishing composition typically is used in conjunction with a polishing pad (e.g., polishing cloth or disk). The polishing pad may contain abrasive material in addition to, or instead of, the abrasive material in the polishing composition.

Silicon dioxide-based inter-metal dielectric layers are frequently used to isolate metal-containing circuit lines formed on a substrate. Polishing compositions for these silicon dioxide-based inter-metal dielectric layers have been particularly well developed in the semiconductor industry, and the chemical and mechanical nature of polishing and wear of the silicon dioxide-based dielectrics is reasonably well understood. One problem with the silicon dioxide-based dielectric materials, however, is that their dielectric constant is relatively high, being approximately 3.9 or higher, depending on factors such as residual moisture content. As a result, the capacitance between the conductive layers is also relatively high, which in turn limits the speed (frequency) at which a circuit can operate. Strategies being developed to increase the frequency at which the circuit can operate include (1) using metals having lower resistivity values (e.g., copper) to form the circuit lines and (2) providing electrical isolation with insulating materials having lower dielectric constants relative to silicon dioxide.

One way to fabricate planar copper circuit traces on a dielectric substrate is referred to as the damascene process. In accordance with this process, the silicon dioxide dielectric surface is patterned by a conventional dry etch process to form holes (i.e., vias) and trenches for vertical and horizontal interconnects prior to deposition of copper onto the surface. Copper has the property of being a fast diffuser during the thermal cycling that a semiconductor substrate experiences during the fabrication process, as well as during actual device operation under applied electric fields, and can move quickly through the underlying dielectric layer and overlying inter-level dielectric (ILD) layers to "poison" the device. Copper diffusion through the substrate dielectric material results in current leakage between adjacent metal lines, leading to degraded device characteristics and, potentially, non-functioning devices. Thus, a diffusion barrier layer is typically applied to the substrate before deposition of copper. Tantalum and tantalum nitride have found wide acceptance in the industry as barrier layer materials and are typically applied to a substrate by physical vapor deposition (PVD). The diffusion barrier layer is provided with a copper seed layer and then over-coated with a copper layer from a copper plating bath. Chemical-mechanical polishing is employed to reduce the thickness of the copper over-layer, as well as to remove the diffusion barrier layer lying outside of the holes and trenches, until a planar surface that exposes elevated portions of the dielectric surface is obtained. The vias and trenches remain filled with electrically conductive copper forming the circuit interconnects.

Typically, at least two polishing steps are utilized in the manufacturing process in which a first polishing step removes most of the copper overburden, and a subsequent polishing step removes barrier material to expose the underlying dielectric layer. The increasing use of insulating materials having lower dielectric constants relative to silicon dioxide, often referred to as "low-κ dielectrics," leads to new challenges in the development of new polishing compositions and methods. Low-κ dielectric materials, which include porous metal oxide, porous or non-porous carbon doped silicon oxide, and fluorine-doped silicon oxide, are typically softer and more brittle than conventional silicon oxide-based dielectric materials. Development of polishing compositions that are effective in removing tantalum-based barrier materials and also soft low-κ dielectric materials is thus complicated. In addition, the chemistry of low-κ dielectric materials differs from that of conventional silicon oxide-based dielectric materials, often exhibiting unacceptably low removal rates when polished with conventional chemical-mechanical polishing compositions.

Moreover, in some schemes, the soft low-κ dielectric materials are capped with harder conventional silicon dioxide-based dielectric materials to allow for greater control over planarization. The capping dielectric also must be removed during polishing to expose the underlying low-κ dielectric material. Polishing compositions that can remove conventional silicon dioxide-based dielectric materials and low-κ dielectric materials at comparable rates are therefore desirable.

BRIEF SUMMARY OF THE INVENTION

The invention provides a chemical-mechanical polishing composition comprising (a) silica, (b) a compound selected from the group consisting of an amine-substituted silane, a tetraalkylammonium salt, a tetraalkylphosphonium salt, a pyridinium salt, and an imidazolium salt, (c) a carboxylic acid having seven or more carbon atoms, (d) an oxidizing agent that oxidizes a metal, (e) optionally, a chelating agent, (f) optionally, a biocide, and (g) water.

The invention also provides a method of chemically-mechanically polishing a substrate, which method comprises (i) contacting a substrate with a chemical-mechanical polishing composition comprising (a) silica, (b) a compound selected from the group consisting of an amine-substituted silane, a tetraalkylammonium salt, a tetraalkylphosphonium salt, a pyridinium salt, and an imidazolium salt, (c) a carboxylic acid having seven or more carbon atoms, (d) an oxidizing agent that oxidizes at least a portion of the substrate, and (e) water, (ii) moving the polishing composition relative to the substrate with the chemical-mechanical polishing composition therebetween, and (iii) abrading at least a portion of the substrate to polish the substrate.

DETAILED DESCRIPTION OF THE INVENTION

The invention provides a chemical-mechanical polishing composition comprising, consisting essentially of, or consisting of (a) silica, (b) a compound selected from the group consisting of an amine-substituted silane, a tetraalkylammonium salt, a tetraalkylphosphonium salt, a pyridinium salt, and an imidazolium salt, (c) a carboxylic acid having seven or more carbon atoms, (d) an oxidizing agent that oxidizes a metal, and (e) water.

The polishing composition comprises silica, which desirably is suspended in the liquid carrier (e.g., water). The polishing composition desirably comprises no abrasive other than silica. The silica typically is in particulate form. Preferably, the silica comprises, consists essentially of, or consists of colloidal silica particles. Colloidal silica particles are prepared via a wet process and typically are non-aggregated, individually discrete particles, which generally are spherical or nearly spherical in shape, but can have other shapes (e.g., shapes with generally elliptical, square, or rectangular cross-sections). Such particles typically are structurally different from fumed silica particles, which are prepared via a pyrogenic or flame hydrolysis process and are chain-like structures of aggregated primary particles.

Preferably, the colloidal silica is precipitated or condensation-polymerized silica, which can be prepared using any method known to those of ordinary skill in the art, such as by the sol gel method or by silicate ion-exchange. Condensation-polymerized silica particles typically are prepared by condensing $Si(OH)_4$ to form substantially spherical particles. The precursor $Si(OH)_4$ can be obtained, for example, by hydrolysis of high purity alkoxysilanes, or by acidification of aqueous silicate solutions. Such abrasive particles can be prepared in accordance with U.S. Pat. No. 5,230,833 or can be obtained as any of various commercially available products such as the BINDZIL 50/80, 30/310, and 40/130 products from EKA Chemicals, the Fuso PL-1, PL-2, PL-3, and PL-3H products, and the Nalco 1034A, 1050, 2327, and 2329 products, as well as other similar products available from DuPont, Bayer, Applied Research, Nissan Chemical (the SNOWTEX products), and Clariant.

Any suitable amount of silica can be present in the polishing composition. The polishing composition can comprise about 0.01 wt. % or more (e.g., about 0.1 wt. %) of silica. Alternatively or in addition, the polishing composition can comprise about 10 wt. % or less (e.g., about 8 wt. % or less, or about 5 wt % or less) of silica. Thus, for example, the polishing composition can comprise about 0.01 wt. % to about 10 wt. % of silica (e.g., about 0.1 wt. % to about 5 wt. %) of silica.

The silica particles can have any suitable particle size. The silica particles desirably have an average particle size of about 5 nm or more (e.g., about 10 nm or more, about 15 nm or more, about 20 nm or more, or about 30 nm or more, or about 40 nm or more). Alternatively or in addition, the silica particles desirably have an average particle size of about 150 nm or less (e.g., about 125 nm or less, or about 100 nm or less). Preferably, the silica particles have an average size of about 20 nm to about 100 nm (e.g., about 30 nm to about 80 nm, or about 40 nm to about 70 nm). In this regard, particle size refers to the diameter of the smallest sphere that encloses the particle.

The silica particles preferably are colloidally stable. The term colloid refers to the suspension of abrasive particles in the water. Colloidal stability refers to the maintenance of that suspension through time. In the context of this invention, the silica particles are considered colloidally stable if, when the silica particles are placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \leq 0.5$).

More preferably, the value of [B]−[T]/[C] is less than or equal to 0.3, and most preferably is less than or equal to 0.1.

The polishing composition comprises a compound selected from the group consisting of an amine-substituted silane, a tetraalkylammonium salt, a tetraalkylphosphonium salt, and an imidazolium salt. The aforesaid compound is referred to herein as a cationic compound. Desirably, the cationic compound interacts with the silica particles such that the silica particles have a positive zeta potential at the pH of the polishing composition.

The cationic compound can be an amine-substituted silane. Suitable silane compounds include primary aminosilanes, secondary aminosilanes, tertiary aminosilanes, quaternary aminosilanes, and dipodal aminosilanes. The aminosilane compound can be any suitable aminosilane, such as a aminopropyl trialkoxysilane (i.e. gamma-aminopropyltriethoxysilane), bis(2-hydroxyethyl)-3-aminopropyl trialkoxysilane, diethylaminomethyltrialkoxysilane, (N,N-diethyl-3-aminopropyl)trialkoxysilane), 3-(N-styrylmethyl-2-aminoethylaminopropyl trialkoxysilane, (2-N-benzylaminoethyl)-3-aminopropyl trialkoxysilane), trialkoxysilyl propyl-N,N,N-trimethyl ammonium chloride, N-(trialkoxysilylethyl)benzyl-N,N,N-trimethyl ammonium chloride, (bis (methyldialkoxysilylpropyl)-N-methyl amine, bis (trialkoxysilylpropyl)urea, bis(3-(trialkoxysilyl)propyl)-ethylenediamine, and bis(trialkoxysilylpropyl)amine, such as bis(trimethoxysilypropyl)amine. The alkoxy groups in the above aminosilane compounds can be substituted by other hydrolizable groups such as halides, amines and carboxylates. Preferably, the silane is dipodal or tripodal. The choice of silane compound depends, in part, on the type of substrate that is being polished.

The cationic compound can be a tetraalkylammonium salt. Preferably, the tetraalkylammonium salt comprises a cation having the structure: $R^1R^2R^3R^4N^+$ wherein $R^1$, $R^2$, $R^3$, and $R^4$ are independently $C_1$-$C_{20}$ alkyl, wherein at least one of $R^1$, $R^2$, $R^3$, and $R^4$ comprises a chain of four or more carbon atoms, with the proviso that $R^1$, $R^2$, $R^3$, and $R^4$ are not all $C_1$ alkyl. The tetraalkylammonium salt can have any suitable anion, such as chloride, bromide, hydroxide, sulfate, hydrogensulfate, methylsulfate, methanesulfonate, p-toluenesulfonate, benzenesulfonate, and the like. Non-limiting examples of suitable tetraalkylammonium cations include triethylmethylammonium, tetraethylammonium, tripropylmethylammonium, tetrapropylammonium, tributylmethylammonium, tributylmethylammonium, tetrabutylammonium, tripropylmethylammonium, tetrapentylammonium, trihexylmethylammonium, tetrahexylammonium, and the like.

The cationic compound can be a tetraalkylphosphonium salt. Preferably, the tetraalkylphosphonium salt comprises a cation having the structure: $R^1R^2R^3R^4P^+$ wherein $R^1$, $R^2$, $R^3$, and $R^4$ are independently $C_1$-$C_{20}$ alkyl. The tetraalkylphosphonium salt can have any suitable anion, such as chloride, bromide, hydroxide, sulfate, hydrogensulfate, methylsulfate, methanesulfonate, p-toluenesulfonate, benzenesulfonate, and the like. Non-limiting examples of suitable tetraalkylphosphonium cations include triethylmethylphosphonium, tetraethylphosphonium, tripropylmethylphosphonium, tetrapropylphosphonium, tributylmethylphosphonium, tetrabutylphosphonium, tripentylmethylphosphonium, tetrapentylphosphonium, trihexylmethylphosphonium, tetrahexylphosphonium, and the like.

The cationic compound can be a pyridinium salt. Preferably, the pyridinium salt comprises a cation having the structure: $C_5H_5NR^+$ wherein R is $C_1$-$C_{10}$ alkyl, optionally substituted with one or more hydroxyl groups. The pyridinium salt can have any suitable anion, such as chloride, bromide, hydroxide, sulfate, hydrogensulfate, methylsulfate, methanesulfonate, p-toluenesulfonate, benzenesulfonate, and the like. Non-limiting examples of suitable pyridinium cations include N-methylpyridinium, N-ethylpyridinium, N-propylpyridinium, N-butylpyridinium, and the like.

The cationic compound can be an imidazolium salt. Preferably, the imidazolium salt comprises a cation having the structure:

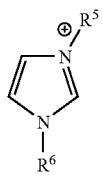

wherein $R^5$ and $R^6$ are independently $C_1$-$C_{20}$ alkyl. The imidazolium salt can have any suitable anion, such as chloride, bromide, hydroxide, sulfate, hydrogensulfate, methylsulfate, methanesulfonate, p-toluenesulfonate, benzenesulfonate, and the like. Non-limiting examples of suitable imidazolium cations include 1,3-dimethylimidazolium, 3-ethyl-1-methylimidazolium, 3-propyl-1-methylimidazolium, 3-isopropyl-1-methylimidazolium, 3-butyl-1-methylimidazolium, 3-pentyl-1-methylimidazolium, and the like.

The polishing composition can comprise any suitable amount of the cationic compound. The polishing composition can comprise about 10 ppm (e.g., about 20 ppm, or about 30 ppm, or about 40 ppm, or about 50 ppm) of the cationic compound. Alternatively or in addition, the polishing composition can comprise about 5000 ppm or less (e.g., about 2500 ppm or less, or about 2000 ppm or less, or about 1500 ppm or less, or about 1000 ppm or less, or about 750 ppm or less, or about 500 ppm or less, or about 250 ppm or less) of the cationic compound. Thus, for example, the polishing composition can comprise about 10 ppm to about 5000 ppm (e.g., about 10 ppm to about 2500 ppm, or about 10 ppm to about 1500 ppm, or about 50 ppm to about 1500 ppm, or about 50 ppm to about 250 ppm) of the cationic compound.

The polishing composition comprises a carboxylic acid having seven or more carbon atoms. The carboxylic acid can be any suitable carboxylic acid. Preferably, the carboxylic acid comprises a cyclic carbon-containing substituent. More preferably, the carboxylic acid comprises at least one aryl ring. The carboxylic acid can have 20 or less carbon atoms (e.g., 18 or less carbon atoms, or 16 or less carbon atoms, or 14 or less carbon atoms, or 12 or less carbon atoms, or 10 or less carbon atoms). In an embodiment, the carboxylic acid is a hydroxybenzoic acid. The hydroxybenzoic acid can have 1 to 3 carboxylic acid groups and 1 to 3 hydroxyl groups. Preferably, the hydroxybenzoic acid is selected from the group consisting of 2-hydroxybenzoic acid, 3-hydroxybenzoic acid, 4-hydroxybenzoic acid, 2,3-dihydroxybenzoic acid, 2,4-dihydroxybenzoic acid, 2,5-dihydroxybenzoic acid, 2,6-dihydroxybenzoic acid, and 3,5-dihydroxybenzoic acid. More preferably, the hydroxybenzoic acid is 2-hydroxybenzoic acid or 2,6-dihydroxybenzoic acid.

In another embodiment, the carboxylic acid does not comprise hydroxyl groups. In this embodiment, preferably the carboxylic acid is selected from the group consisting of benzoic acid, 1,2-benzenedicarboxylic acid, 1,2,4-benzenetricarboxylic acid, phenylmalonic acid, cyclohexanecarboxylic acid, trans-cyclohexane-1,2-dicarboxylic acid, and phenylmalonic acid.

The polishing composition can comprise any suitable amount of the carboxylic acid. The polishing composition can comprise about 10 ppm or more (e.g., about 25 ppm or more, or about 50 ppm or more, or about 75 ppm or more, or about 100 ppm or more) of the carboxylic acid. Alternatively or in addition, the polishing composition can comprise about 2000 ppm or less (e.g., about 1000 ppm or less, or about 800 ppm or less, or about 700 ppm or less, or about 600 ppm or less, or about 500 ppm or less) of the carboxylic acid. Thus, for example, the polishing composition can comprise about 10 ppm to about 2000 ppm (e.g., about 50 ppm to about 1000 ppm, or about 100 ppm to about 500 ppm) of the carboxylic acid.

It will be appreciated that many of the aforementioned compounds can exist in the form of a salt (e.g., a metal salt, an ammonium salt, or the like), an acid, or as a partial salt. For example, 1,2-benzenedicarboxylic acid includes 1,2-benzenedicarboxylic acid, as well as mono-salts (e.g., potassium hydrogen 1,2-benzenedicarboxylic acid) and di-salts thereof. Amines (e.g., aminopropyltriethoxysilane) include the amines as well as acid addition salts thereof (e.g., aminopropyltriethoxysilane hydrochloride).

The polishing composition comprises an oxidizing agent that oxidizes a metal. The function of the oxidizing agent is to oxidize at least a part of a substrate, such as a layer or layers comprising copper and/or tantalum. The oxidizing agent can be any suitable oxidizing agent. Non-limiting examples of suitable oxidizing agents include hydrogen peroxide, persulfate salts (e.g., ammonium persulfate), ferric salts (e.g., ferric nitrate), solid forms of hydrogen peroxide, and combinations thereof. Solid forms of hydrogen peroxide include sodium percarbonate, calcium peroxide, and magnesium peroxide, which liberate free hydrogen peroxide when dissolved in water. Preferably, the oxidizing agent is hydrogen peroxide.

The polishing composition can comprise any suitable amount the oxidizing agent. The polishing composition can comprise about 0.1 wt. % or more (e.g., about 0.2 wt. % or more, or about 0.5 wt. % or more) of the oxidizing agent. Alternatively or in addition, the polishing composition can comprise about 5 wt. % or less (e.g., about 4 wt. % or less, or about 3 wt. % or less, or about 2 wt. % or less) of the oxidizing agent. Thus for example, the polishing composition can comprise about 0.1 wt. % to about 5 wt. % (e.g., about 0.2 wt. % to about 4 wt. %, or about 0.5 wt. % to about 2 wt. %) of the oxidizing agent.

The polishing composition also may contain boric acid. When present, the polishing composition typically comprises about 100 ppm or more (e.g., about 200 ppm or more, or about 300 ppm or more) of boric acid. Preferably, the polishing composition comprises about 1000 ppm or less (e.g., about 900 ppm or less, or about 800 ppm or less) of boric acid. More preferably, the polishing composition comprises about 100 ppm to about 1000 ppm (e.g., about 200 ppm to about 900 ppm, or about 300 ppm to about 800 ppm) of boric acid.

The polishing composition also may contain a corrosion inhibitor. For the purposes of this invention, a corrosion inhibitor is any compound, or mixture of compounds, that facilitates the formation of a passivation layer (i.e., a dissolution-inhibiting layer) on at least a portion of the surface of the substrate being polished. Desirably, the corrosion inhibitor is a corrosion inhibitor for copper. A corrosion inhibitor for copper is any compound that facilitates the formation of a passivation layer on copper. When present, the polishing composition typically comprises about 10 ppm or more (e.g., about 50 ppm or more, or about 100 ppm or more) of a corrosion inhibitor for copper. Preferably, the polishing composition comprises about 5000 ppm or less (e.g., about 2500 ppm or less, or about 1000 ppm or less, or about 900 ppm or less, or about 800 ppm or less) of a corrosion inhibitor for copper. More preferably, the polishing composition comprises about 10 ppm to about 5000 ppm (e.g., about 10 ppm to about 2500 ppm, or about 25 ppm to about 1000 ppm, or about 50 ppm to about 800 ppm) of a corrosion inhibitor for copper. Preferably, the corrosion inhibitor for copper comprises a triazole or a tetrazole group. More preferably, the corrosion inhibitor for copper is a benzotriazole compound selected from the group consisting of benzotriazole, 4-methylbenzotriazole, 5-methylbenzotriazole, 5-chlorobenzotriazole, and combinations thereof. Most preferably, the corrosion inhibitor for copper is benzotriazole.

The polishing composition can have any suitable pH. The polishing composition typically has a pH of about 1 or more (e.g., about 2 or more, or about 3 or more). Preferably, the polishing composition has a pH of about 6 or less (e.g., about 5 or less, or about 4 or less). More preferably, the polishing composition has a pH of about 1 to about 6 (e.g., about 2 to about 5, or about 2 to about 4, or about 3 to about 5). The polishing composition can comprise pH adjusting agents, for example, nitric acid, sulfuric acid, ammonium hydroxide, and the like. The polishing composition optionally comprises pH buffering systems, for example, a borate buffer or a hydrogen sulfate buffer. The pH of the polishing composition can be achieved and/or maintained by any suitable means. More specifically, the polishing composition can further comprise a pH adjustor, a pH buffering agent, or a combination thereof. The pH adjustor can be any suitable pH-adjusting compound. For example, the pH adjustor can be nitric acid, potassium hydroxide, or a combination thereof. The pH buffering agent can be any suitable buffering agent, for example, phosphates, sulfates, acetates, borates, ammonium salts, and the like. The polishing composition can comprise any suitable amount of a pH adjustor and/or a pH buffering agent, provided that a suitable amount of the buffering agent is used to achieve and/or maintain the pH of the polishing composition within the ranges set forth herein.

Desirably, the silica will have a zeta potential of greater than 0 mV in the polishing composition. The zeta potential of a particle refers to the difference between the electrical charge of the ions surrounding the particle and the electrical charge of the bulk solution (e.g., the liquid carrier and any other components dissolved therein).

The polishing composition can comprise a biocide. The biocide can comprise any suitable biocide, for example an isothiazolinone biocide. The amount of biocide in the polishing composition typically is about 1 ppm to about 50 ppm, preferably about 1 ppm to about 20 ppm.

The polishing composition can comprise a chelating agent. Examples of suitable chelating agents include ethylenediaminetetraacetic acid, partial salts thereof (e.g., disodium ethylenediaminetetraacetic acid), and the like.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., silica, a cationic compound, a carboxylic acid having seven or more carbon atoms, an oxidizing agent, etc.) as well as any combination of ingredients (e.g., silica, a cationic, a carboxylic acid having seven or more carbon atoms, an oxidizing agent, optional biocide, etc.).

For example, the silica can be dispersed in water. The cationic compound, and carboxylic acid having seven or more carbon atoms can then be added, and mixed by any method that is capable of incorporating the components into the polishing composition. The oxidizing agent can be added at any time during the preparation of the polishing composition. The polishing composition can be prepared prior to use, with one or more components, such as the oxidizing agent, added to the polishing composition just before use (e.g., within about 1 minute before use, or within about 1 hour before use, or within about 7 days before use). The polishing composition also can be prepared by mixing the components at the surface of the substrate during the polishing operation.

The polishing composition can be supplied as a one-package system comprising silica, a cationic compound, a carboxylic acid having seven or more carbon atoms, optional biocide, and water. Alternatively, the silica can be supplied as a dispersion in water in a first container, and a cationic compound, a carboxylic acid having seven or more carbon atoms, and optional biocide can be supplied in a second container, either in dry form, or as a solution or dispersion in water. The oxidizing agent desirably is supplied separately from the other components of the polishing composition and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). The components in the first or second container can be in dry form while the components in the other container can be in the form of an aqueous dispersion. Moreover, it is suitable for the components in the first and second containers to have different pH values, or alternatively to have substantially similar, or even equal, pH values. Other two-container, or three- or more-container, combinations of the components of the polishing composition are within the knowledge of one of ordinary skill in the art.

The polishing composition of the invention also can be provided as a concentrate which is intended to be diluted with an appropriate amount of water prior to use. In such an embodiment, the polishing composition concentrate can comprise the silica, a cationic compound, a carboxylic acid having seven or more carbon atoms, optional biocide, and water, with or without the oxidizing agent, in amounts such that, upon dilution of the concentrate with an appropriate amount of water, and the oxidizing agent if not already present in an appropriate amount, each component of the polishing composition will be present in the polishing composition in an amount within the appropriate range recited above for each component. For example, the silica, cationic compound, carboxylic acid having seven or more carbon atoms, and optional biocide can each be present in the concentration in an amount that is about 2 times (e.g., about 3 times, about 4 times, or about 5 times) greater than the concentration recited above for each component so that, when the concentrate is diluted with an equal volume of (e.g., 2 equal volumes of water, 3 equal volumes of water, or 4 equal volumes of water, respectively), along with the oxidizing agent in a suitable amount, each component will be present in the polishing composition in an amount within the ranges set forth above for each component. Furthermore, as will be understood by those of ordinary skill in the art, the concentrate can contain an appropriate fraction of the water present in the final polishing composition in order to ensure that other components are at least partially or fully dissolved in the concentrate.

Although the polishing composition of the invention can be used to polish any substrate, the polishing composition is particularly useful in the polishing of a substrate comprising at least one metal layer comprising copper, at least one metal layer comprising tantalum, and at least one dielectric layer.

The metal layers can be disposed anywhere on the substrate, but preferably at least one tantalum layer is disposed between at least one copper layer and at least one dielectric layer. The tantalum layer can comprise tantalum metal or can comprise a suitable tantalum-containing compound, such as tantalum nitride, or a mixture of tantalum metal and a tantalum-containing compound. When the tantalum layer comprises tantalum nitride, the tantalum nitride can comprise a stoichiometric tantalum nitride (i.e., TaN) or a nonstoichiometric tantalum nitride, for example, $TaN_{0.5}$. The tantalum layer also can comprise a tantalum-containing compound of tantalum with nitrogen and carbon represented by the formula $TaN_xC_y$, wherein $x+y \leq 1$. The dielectric layer can be a metal oxide such as a silicon oxide layer derived from tetraethylorthosilicate (TEOS), porous metal oxide, porous or non-porous carbon doped silicon oxide, fluorine-doped silicon oxide, glass, organic polymer, fluorinated organic polymer, or any other suitable high or low-k insulating layer. Preferably, the dielectric layer is a carbon doped silicon oxide, such as the CORAL™ and BLACK DIAMOND™ materials, available from Novellus Systems (San Jose, Calif.) and Applied Materials (Santa Clara, Calif.), respectively.

Advantageously, the inventive method provides enhanced removal rates for low-κ dielectric layers, in particular, for carbon doped silicon oxide layers, as compared with prior art polishing methods.

The polishing method of the invention is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate (such as copper, tantalum, tantalum-containing compounds, and/or dielectric material as described herein) to polish the substrate.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, conformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate the invention but, of course, should not be construed as in any way limiting its scope.

In the following Examples, the carbon doped silicon oxide dielectric material was the CORAL™ product from Novellus Systems (San Jose, Calif.) (hereinafter "C-doped silica"), while the silicon oxide dielectric material was generated from tetraethylorthosilicate (hereinafter "TEOS"). The polishing conditions were as follows: downforce of 8.9-10.3 kPa (1.3-1.5 psi), platen speed of 103 rpm, carrier speed of 97 ppm, and polishing composition delivery rate of 200 ml/min, using a Politex polishing pad.

EXAMPLE 1

This example demonstrates the effect of the carboxylic acid having seven carbon atoms or more on the removal rate observed for copper, tantalum, C-doped silica, and TEOS achievable by the polishing method of the invention.

Eleven similar sets of four substrates, each of which substrates separately comprised copper, tantalum, C-doped silica, and TEOS, were polished with eleven different polishing compositions (Compositions 1A-1K). Each of Compositions 1A-1K contained 2 wt. % of colloidal silica having an average particle size of 35 nm, 100 ppm 3-aminopropyltriethoxysilane, 100 ppm boric acid, 500 ppm benzotriazole, and 1 wt. % hydrogen peroxide, in water at a pH of 4.1. Compositions 1A-1K further contained nitric acid ($HNO_3$), 3,4-dihydroxybenzoic acid (3,4-HBA), 3-hydroxybenzoic acid (3-HBA), 4-hydroxybenzoic acid (4-HBA), 1,2,4-benzenetricarboxylic acid (1,2,4-BCA), 2,4-dihydroxybenzoic acid (2,4-HBA), benzoic acid (BA), phthalic acid (PA), 2,5-dihydroxybenzoic acid (2,5-HBA), 2-hydroxybenzoic acid (2-HBA), and 2,6-dihydroxybenzoic acid (2,6-HBA), respectively, at a concentration of 2.9 mM.

After polishing, the removal rates ("RR") for copper, tantalum, Coral®, and TEOS were determined, and the results are set forth in Table 1.

TABLE 1

| Composition | Acid | TEOS RR ($Å$/min) | C-doped silica RR ($Å$/min) | Tantalum RR ($Å$/min) | Copper RR ($Å$/min) |
|---|---|---|---|---|---|
| 1A (control) | $HNO_3$ | 770 | 150 | 925 | 117 |
| 1B (invention) | 3,4-HBA | 973 | 180 | 1060 | 48 |
| 1C (invention) | 3-HBA | 905 | 240 | 941 | 0 |
| 1D (invention) | 4-HBA | 1004 | 240 | 985 | 31 |
| 1E (invention) | 1,2,4-BCA | 731 | 260 | 1002 | 288 |
| 1F (invention) | 2,4-HBA | 892 | 290 | 889 | 0 |
| 1G (invention) | BA | 997 | 310 | 986 | 89 |
| 1H (invention) | PA | 752 | 360 | 993 | 244 |
| 1I (invention) | 2.5-HBA | 765 | 390 | 904 | 29 |
| 1J (invention) | 2-HBA | 866 | 520 | 843 | 0 |
| 1K (invention) | 2,6-HBA | 825 | 730 | 838 | 143 |

As is apparent from the results set forth in Table 1, Compositions 1B-1K, which contained carboxylic acids having 7 or more carbon atoms, exhibited C-doped silica removal rates that were approximately 20-387% greater than the C-doped silica removal rate exhibited by the control polishing composition, which contained nitric acid.

EXAMPLE 2

This example demonstrates the effect of the carboxylic acid having seven carbon atoms or more on the removal rate observed for tantalum, Coral®, and TEOS achievable by the invention.

Thirty-three similar sets of four substrates, each of which substrates separately comprised TEOS, C-doped silica, and tantalum, were polished with eleven different polishing compositions (Compositions 2A-2K). Each of the Compositions 2A-2K was formulated at a pH of 4.5, 4.0, or 3.5, and each of Compositions 2A-2K contained 2 wt. % of colloidal silica having an average particle size of 35 nm, 100 ppm of 3-aminopropyltriethoxysilane, 500 ppm of benzotriazole, and 1 wt. % of hydrogen peroxide in water. Compositions 2A-2K further contained nitric acid, 2-hydroxybenzoic acid (2-HBA), malonic acid, phenylmalonic acid, cyclohexanecarboxylic acid, trans-cyclohexane-1,2-dicarboxylic acid, pyrogallol, pyrocatechol, trans-1,2-cyclohexanediol, 2-aminophenol, and 4-methoxyphenol, at a concentration of 2.9 mM, respectively.

After polishing, the removal rates for TEOS, C-doped silica, and tantalum ("Ta") were determined in Å/min, and the results are set forth in Table 2.

TABLE 2

| Composition | pH 4.5 | | | pH 4.0 | | | pH 3.5 | | |
|---|---|---|---|---|---|---|---|---|---|
| | TEOS | C-doped silica | Ta | TEOS | C-doped silica | Ta | TEOS | C-doped silica | Ta |
| 2A (control) | 830 | 210 | 851 | 651 | 190 | 967 | 272 | 190 | 941 |
| 2B (invention) | 837 | 610 | 783 | 750 | 640 | 847 | 342 | 540 | 939 |
| 2C (control) | 703 | 240 | 809 | 629 | 220 | 854 | 247 | 160 | 845 |
| 2D (invention) | 636 | 360 | 644 | 620 | 380 | 840 | 415 | 330 | 768 |
| 2E (invention) | 771 | 340 | 683 | 781 | 230 | 835 | 170 | 160 | 871 |
| 2F (invention) | 945 | 360 | 691 | 738 | 250 | 945 | 217 | 150 | 848 |
| 2G (invention) | 753 | 180 | 790 | 612 | 170 | 844 | 200 | 170 | 833 |
| 2H (invention) | 831 | 190 | 829 | 597 | 170 | 894 | 191 | 140 | 764 |
| 2I (invention) | 888 | 180 | 882 | 670 | 170 | 795 | 188 | 190 | 802 |
| 2J (invention) | 842 | 190 | 724 | 618 | 150 | 767 | 99 | 140 | 763 |
| 2K (invention) | 780 | 180 | 824 | 583 | 140 | 814 | 179 | 170 | 871 |

As is apparent from the results set forth in Table 2, Compositions 2B, 2D, 2E, 2F, and 2G, which contained carboxylic acids having 7 or more carbon atoms, exhibited C-doped silica removal rates that were approximately 62 to 190% greater at pH 4.5, 9.5 to 237% greater at pH 4.0, and −21 to 184% greater at pH 3.5, than the control polishing composition, which contained nitric acid.

EXAMPLE 3

This example demonstrates the effect of tetrabutylphosphonium hydroxide ("TBPH") (i.e., a tetraalkylphosphonium salt) and 2,6-dihydroxybenzoic acid ("2,6-HBA") (i.e., a carboxylic acid having 7 or more carbon atoms) on the removal rate observed for C-doped silica and TEOS achievable by the polishing method of the invention.

Fourteen similar sets of four substrates, each of which substrates separately comprised TEOS and C-doped silica, were polished with fourteen different polishing compositions (Compositions 3A-3N). Each of Compositions 3A-3N contained 4 wt. % colloidal silica having an average particle size of 20 nm, 500 ppm of benzotriazole, 10 ppm of ethylenediaminetetraacetic acid, and 1 wt. % of hydrogen peroxide in water, at a pH of 3.5. Compositions 3B-3N further contained tetrabutylphosphonium hydroxide or tetrabutylphosphonium hydroxide plus 2,6-hydroxybenzoic acid in amounts set forth in Table 3.

After polishing, the removal rates for TEOS and C-doped silica were determined, and the results are set forth in Table 3.

TABLE 3

| Composition | TBPH (ppm) | 2,6-HBA (ppm) | TEOS RR (Å/min) | C-doped silica RR (Å/min) |
|---|---|---|---|---|
| 3A | 0 | 0 | 21 | 147 |
| 3B | 100 | 0 | 53 | 338 |
| 3C | 300 | 364 | 364 | 187 |
| 3D | 500 | 0 | 410 | 152 |
| 3E | 500 | 300 | 557 | 152 |
| 3F | 500 | 500 | 493 | 183 |
| 3G | 500 | 800 | 351 | 250 |

TABLE 3-continued

| Composition | TBPH (ppm) | 2,6-HBA (ppm) | TEOS RR (Å/min) | C-doped silica RR (Å/min) |
|---|---|---|---|---|
| 3H | 1000 | 0 | 694 | 134 |
| 3I | 1000 | 500 | 959 | 181 |
| 3J | 1000 | 900 | 796 | 318 |
| 3K | 1000 | 1300 | 634 | 478 |
| 3L | 1000 | 1800 | 105 | 503 |
| 3M | 1000 | 2500 | 274 | 494 |
| 3N | 1000 | 3000 | 224 | 485 |

As is apparent from the results set forth in Table 3, Composition 3G, which contained 500 ppm of tetrabutylphosphonium hydroxide and 800 ppm of 2,6-hydroxybenzoic acid, exhibited a C-doped silica removal rate that was approximately 64% greater than the C-doped silica removal rate exhibited by Composition 3D, which contained 500 ppm of tetrabutylphosphonium hydroxide but no 2,6-hydroxybenzoic acid. Composition 3L, which contained 1000 ppm of tetrabutylphosphonium hydroxide and 1800 ppm of 2,6-hydroxybenzoic acid, exhibited a C-doped silica removal rate that was approximately 275% greater than the C-doped silica removal rate exhibited by Composition 3H, which contained 1000 ppm of tetrabutylphosphonium hydroxide but no 2,6-hydroxybenzoic acid. Compositions 3M and 3N, which contained 1000 ppm of tetrabutylphosphonium hydroxide and 2500 and 3000 ppm of 2,6-hydroxybenzoic acid, respectively, exhibited C-doped silica removal rates that were 98% and 96%, respectively, of the C-doped silica removal rate exhibited by Composition 3L. The C-doped silica removal exhibited by Composition 3B appears to be an anomalous result.

EXAMPLE 4

This example demonstrates the effect of an imidazolium salt in combination with a carboxylic acid having 7 or more carbon atoms on the removal rate observed for C-doped silica, TEOS, and tantalum, achievable by the polishing method of the invention.

Six similar sets of three substrates, each of which substrates separately comprised TEOS, Coral®, and tantalum, were polished with six different polishing compositions (Compositions 4A-4F). Each of Compositions 4A-4F contained 4 wt. % colloidal silica having an average particle size of 20 nm, 3-butyl-1-methyl-1H-imidazolium chloride ("BMI") in amounts set forth in Table 4, 250 ppm of benzotriazole, 10 ppm of ethylenediaminetetraacetic acid, and 1 wt. % of hydrogen peroxide in water, at a pH of 3.5. Compositions 4B-4F further contained 2,6-dihydroxybenzoic acid ("2,6-HBA") in the amounts set forth in Table 4, while Composition 4A did not contain 2,6-HBA.

After polishing, the removal rates for TEOS, C-doped silica, and tantalum were determined, and the results are set forth in Table 4.

TABLE 4

| Composition | BMI (ppm) | 2,6-HBA | C-doped silica RR (Å/min) | TEOS RR (Å/min) | Ta RR (Å/min) |
|---|---|---|---|---|---|
| 4A | 650 | 0 | 103 | 483 | 540 |
| 4B | 650 | 1300 | 265 | 349 | 546 |
| 4C | 325 | 500 | 223 | 340 | 516 |
| 4D | 325 | 1300 | 235 | 264 | 557 |
| 4E | 975 | 500 | 164 | 427 | 539 |
| 4F | 975 | 1300 | 245 | 371 | 531 |

As is apparent from the results set forth in Table 4, Composition 4B, which contained 650 ppm of BMI and 1300 ppm of 2,6-HBA, exhibited a C-doped silica removal rate that was approximately 157% greater than the C-doped silica removal rate exhibited by Composition 4A, which did not contain any 2,6-HBA, while exhibiting a TEOS removal rate that was approximately 72% the TEOS removal rate exhibited by Composition 4A. Composition 4F, which contained 975 ppm of BMI and 1300 ppm 2,6-HBA, exhibited a C-doped silica removal rate that was approximately 92% of the C-doped silica removal rate exhibited by Composition 4B, which contained 650 ppm of BMI and 1300 ppm of 2,6-HBA. Composition 4D, which contained 325 ppm of BMI and 1300 ppm 2,6-HBA, exhibited a C-doped silica removal rate that was approximately 89% of the C-doped silica removal rate exhibited by Composition 4B, which contained 650 ppm of BMI and 1300 ppm of 2,6-HBA, and a TEOS removal rate that was approximately 76% of the TEOS removal rate exhibited by Composition 4B.

EXAMPLE 5

This example demonstrates the effect of the alkyl group chain length in tetraalkylammonium salts on the removal rate observed for C-doped silica, TEOS, and tantalum, achievable by the polishing method of the invention.

Six similar sets of three substrates, each of which substrates separately comprised TEOS, C-doped silica, and tantalum, were polished with six different polishing compositions (Compositions 5A-5F), each of which polishing compositions were formulated at a pH of 3.5 or 4.0. Compositions 5A-5C further contained 1000 ppm of tetrabutylammonium hydroxide ("TBAH") as a cationic component, with Compositions 5B and 5C also further containing 2,6-dihydroxybenzoic acid ("2,6-HBA"). Compositions 5D-5F further contained 1000 ppm of tetramethylammonium hydroxide ("TMAH"), with Compositions 5E and 5F also further containing 2,6-HBA. The amounts of 2,6-HBA in each of the Compositions as well as the pH of the Compositions is set forth in Table 5.

After polishing, the removal rates for TEOS, C-doped silica, and tantalum were determined, and the results are set forth in Table 5.

TABLE 5

| Composition | Cationic component | 2,6-HBA | pH | C-doped silica RR (Å/min) | TEOS RR (Å/min) | Ta RR (Å/min) |
|---|---|---|---|---|---|---|
| 5A | TBAH | 0 | 3.5 | 19 | 186 | 591 |
| 5A | TBAH | 0 | 4.0 | 20 | 196 | 467 |
| 5B | TBAH | 650 | 3.5 | 144 | 746 | 570 |
| 5B | TBAH | 650 | 4.0 | 164 | 682 | 599 |
| 5C | TBAH | 1300 | 3.5 | 541 | 588 | 632 |
| 5C | TBAH | 1300 | 4.0 | 557 | 647 | 715 |
| 5D | TMAH | 0 | 3.5 | 65 | 76 | 458 |
| 5D | TMAH | 0 | 4.0 | 52 | 65 | 417 |
| 5E | TMAH | 650 | 3.5 | 131 | 88 | 582 |
| 5E | TMAH | 650 | 4.0 | 112 | 104 | 540 |
| 5F | TMAH | 1300 | 3.5 | 91 | 68 | 293 |
| 5F | TMAH | 1300 | 4.0 | 79 | 42 | 420 |

As is apparent, Composition 5B, which contained 1000 ppm of tetrabutylammonium hydroxide and 650 ppm of 2,6-HBA, exhibited C-doped silica and TEOS removal rates that were approximately 7.6 times and 4.0 times greater, respectively, at pH 3.5 and approximately 8.2 times and 3.5 times greater, respectively, at pH 4.0 than Composition 5A, which contained 1000 ppm of tetrabutylammonium hydroxide but did not contain any 2,6-HBA. Composition 5C, which contained 1000 ppm of tetrabutylammonium hydroxide and 1300 ppm of 2,6-HBA, exhibited C-doped silica and TEOS removal rates that were approximately 28.5 times and 3.2 times greater, respectively, at pH 3.5 and approximately 27.9 times and 3.3 times greater, respectively, at pH 4.0 than Composition 5A. Compositions 5E and 5F, which contained 1000 ppm of tetramethylammonium hydroxide and 650 or 1300 ppm of 2,6-HBA, respectively, exhibited at best C-doped silica and TEOS removal rates that were approximately 2.2 times and 1.6 times greater, respectively, than Composition 5D, which contained 1000 ppm of tetramethylammonium hydroxide but did not contain any 2,6-HBA.

EXAMPLE 6

This example demonstrates the effect of the carboxylic acid having seven carbon atoms or more on the removal rate observed for C-doped silica, TEOS, and tantalum, achievable by the polishing method of the invention.

Compositions 6A and 6B were formulated and used to polish substrates comprising TEOS, C-doped silica, and tantalum. Both of the Compositions 6A and 6B were formulated at a pH of 4.2, and contained 2 wt. % of colloidal silica having an average particle size of 35 nm, 150 ppm of bis(trimethoxysilylpropyl)amine, 500 ppm of benzotriazole, and 1 wt. % of hydrogen peroxide in water. Compositions 6A and 6B further contained acetic acid (control) and dihydroxybenzoic acid (inventive), at a concentration of 2.9 mM, respectively. The polishing was done on 300 mm wafers using 1.5 psi downforce.

After polishing, the removal rates for TEOS, C-doped silica, and tantalum ("Ta") were determined in Å/min, and the results are set forth in Table 6.

TABLE 6

|  | TEOS | C-doped Silica | Ta |
| --- | --- | --- | --- |
| 6A (Control) | 1096 | 381 | 783 |
| 6B (Inventive) | 1226 | 746 | 800 |

As is apparent from the data in Table 6, the composition with a carboxylic acid having seven or more carbon atoms demonstrated higher removal rates for all substrates as compared to the composition with acetic acid.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
    (a) wet-process silica particles,
    (b) a cationic compound selected from the group consisting of an amine-substituted silane, a tetraalkylammonium salt, a tetraalkylphosphonium salt, a pyridinium salt, and an imidazolium salt,
    (c) a carboxylic acid having seven or more carbon atoms,
    (d) an oxidizing agent that oxidizes a metal, and
    (e) water,
wherein the polishing composition has a pH of about 1 to about 6, and wherein the cationic compound interacts with the silica particles such that the silica particles have a positive zeta potential at the pH of the polishing composition.

2. The polishing composition of claim 1, wherein the polishing composition comprises about 0.1 wt. % to about 5 wt. % silica particles.

3. The polishing composition of claim 1, wherein the silica particles have an average particle size of about 20 nm to about 100 nm.

4. The polishing composition of claim 1, wherein the polishing composition comprises an amine-substituted silane.

5. The polishing composition of claim 4, wherein the amine-substituted silane is selected from the group consisting of aminopropyl trialkoxysilane, bis(2-hydroxyethyl)-3-aminopropyl trialkoxysilane, diethylaminomethyltrialkoxysilane, (N,N-diethyl-3-aminopropyl) trialkoxysilane), 3-(N-styrylmethyl)-2-aminoethylaminopropyl triaalkoxysilane, (2-N-benzylaminoethyl)-3-aminopropyl trialkoxysilane, trialkoxysilyl propyl-N,N,N-trimethyl ammonium chloride, N-(trialkoxysilylethyl)benzyl-N,N,N-trimethyl ammonium chloride, (bis(methyldialkoxysilylpropyl)-N-methyl amine, bis(trialkoxysilylpropyl) urea, bis(3-(trialkoxysilyl)propyl)-ethylenediamine, and bis(3-(trialkoxysilyl)propyl)amine.

6. The polishing composition of claim 4, wherein the polishing composition comprises about 50 ppm to about 500 ppm of the amine-substituted silane.

7. The polishing composition of claim 1, wherein the polishing composition comprises a tetraalkylammonium salt.

8. The polishing composition of claim 7, wherein the polishing composition comprises about 50 ppm to about 1500 ppm of the tetraalkylammonium salt.

9. The polishing composition of claim 1, wherein the polishing composition comprises a tetraalkylphosphonium salt.

10. The polishing composition of claim 9, wherein the polishing composition comprises about 10 ppm to about 1500 ppm of the tetraalkylphosphonium salt.

11. The polishing composition of claim 1, wherein the polishing composition comprises a pyridinium salt.

12. The polishing composition of claim 11, wherein the polishing composition comprises about 10 ppm to about 1000 ppm of the pyridinium salt.

13. The polishing composition of claim 1, wherein the polishing composition comprises an imidazolium salt.

14. The polishing composition of claim 13, wherein the polishing composition comprises about 10 ppm to about 1000 ppm of the imidazolium salt.

15. The polishing composition of claim 1, wherein the carboxylic acid comprises a cyclic carbon-containing substituent.

16. The polishing composition of claim 15, wherein the carboxylic acid is selected from the group consisting of 2-hydroxybenzoic acid, 3-hydroxybenzoic acid, 4-hydroxybenzoic acid, 2,3-dihydroxybenzoic acid, 2,4-dihydroxybenzoic acid, 2,5-dihydroxybenzoic acid, 2,6-dihydroxybenzoic acid, and 3,5-dihydroxybenzoic acid.

17. The polishing composition of claim 16, wherein the carboxylic acid is 2-hydroxybenzoic acid.

18. The polishing composition of claim 16, wherein the carboxylic acid is 2,6-dihydroxybenzoic acid.

19. The polishing composition of claim 1, wherein the carboxylic acid is selected from the group consisting of benzoic acid, 1,2-benzenedicarboxylic acid, 1,2,4-benzenetricarboxylic acid, phenylmalonic acid, cyclohexanecarboxylic acid, trans-cyclohexane-1,2-dicarboxylic acid, and phenylmalonic acid.

20. The polishing composition of claim 19, wherein the polishing composition comprises about 10 ppm to about 2000 ppm of the carboxylic acid.

21. The polishing composition of claim 1, wherein the oxidizing agent is hydrogen peroxide.

22. The polishing composition of claim 1, wherein the polishing composition further comprises a corrosion inhibitor.

23. The polishing composition of claim 22, wherein the corrosion inhibitor comprises a triazole or a tetrazole group.

24. The polishing composition of claim 22, wherein the corrosion inhibitor is benzotriazole.

25. The polishing composition of claim 22, wherein the polishing composition comprises about 10 ppm to about 1000 ppm of the corrosion inhibitor.

26. The polishing composition of claim 1, wherein the polishing composition has a pH of about 3 to about 5.

27. A method of chemically-mechanically polishing a substrate, which method comprises:
  (i) contacting a substrate with a chemical-mechanical polishing composition comprising:
    (a) wet-process silica particles,
    (b) a compound selected from the group consisting of an amine-substituted silane, a tetraalkylammonium salt, a tetraalkylphosphonium salt, and an imidazolium salt,
    (c) a carboxylic acid having seven or more carbon atoms,
    (d) an oxidizing agent that oxidizes at least a portion of a substrate, and
    (e) water,
  wherein the polishing composition has a pH of about 1 to about 6, and wherein the cationic compound interacts with the silica particles such that the silica particles have a positive zeta potential at the pH of the polishing composition,
  (ii) moving the polishing composition relative to the substrate with the chemical-mechanical polishing composition therebetween, and
  (iii) abrading at least a portion of the substrate to polish the substrate.

28. The method of claim 27, wherein the polishing composition comprises about 0.1 wt. % to about 5 wt. % silica particles.

29. The method of claim 27, wherein the silica particles have an average particle size of about 20 nm to about 100 nm.

30. The method of claim 27, wherein the polishing composition comprises an amine-substituted silane.

31. The method of claim 30, wherein the amine-substituted silane is selected from the group consisting of aminopropyl trialkoxysilane, bis(2-hydroxyethyl)-3-aminopropyl trialkoxysilane, diethylaminomethyltrialkoxysilane, (N,N-diethyl-3-aminopropyl) trialkoxysilane), 3-(N-styrylmethyl)-2-aminoethylaminopropyl triaalkoxysilane, (2-N-benzylaminoethyl)-3-aminopropyl trialkoxysilane, trialkoxysilyl propyl-N,N,N-trimethyl ammonium chloride, N-(trialkoxysilylethyl)benzyl-N,N,N-trimethyl ammonium chloride, (bis(methyldialkoxysilylpropyl)-N-methyl amine, bis(trialkoxysilylpropyl) urea, bis(3-(trialkoxysilyppropyl)-ethylenediamine, and bis(3-(trialkoxysilyl)propyl)amine.

32. The method of claim 27, wherein the polishing composition comprises about 50 ppm to about 500 ppm of the amine-substituted silane.

33. The method of claim 27, wherein the polishing composition comprises a tetraalkylammonium salt.

34. The method of claim 33, wherein the polishing composition comprises about 50 ppm to about 1500 ppm of the tetraalkylammonium salt.

35. The method of claim 27, wherein the polishing composition comprises a tetraalkylphosphonium salt.

36. The method of claim 35, wherein the polishing composition comprises about 50 ppm to about 250 ppm of the tetraalkylphosphonium salt.

37. The method of claim 27, wherein the polishing composition comprises a pyridinium salt.

38. The method of claim 37, wherein the polishing composition comprises about 50 ppm to about 250 ppm of the pyridinium salt.

39. The method of claim 27, wherein the polishing composition comprises an imidazolium salt.

40. The method of claim 39, wherein the polishing composition comprises about 50 ppm to about 250 ppm of the imidazolium salt.

41. The method of claim 27, wherein the carboxylic acid comprises a cyclic carbon-containing substituent.

42. The method of claim 27, wherein the polishing composition comprises about 100 ppm to about 500 ppm of the carboxylic acid.

43. The method of claim 27, wherein the substrate comprises silicon dioxide, and a portion of the silicon dioxide is removed from the substrate to polish the substrate.

44. The method of claim 43, wherein the silicon dioxide is carbon-doped silicon dioxide.

45. The method of claim 44, wherein the substrate further comprises tantalum, and a portion of the tantalum is removed from the substrate to polish the substrate.

46. The method of claim 45, wherein the substrate further comprises copper, and a portion of the copper is removed from the substrate to polish the substrate.

* * * * *